United States Patent
Uehara et al.

(10) Patent No.: US 12,342,590 B2
(45) Date of Patent: Jun. 24, 2025

(54) SEMICONDUCTOR DEVICE

(71) Applicant: DENSO CORPORATION, Kariya (JP)

(72) Inventors: Junichi Uehara, Kariya (JP); Takehiro Kato, Toyota (JP); Tadashi Misumi, Nisshin (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 530 days.

(21) Appl. No.: 17/678,105

(22) Filed: Feb. 23, 2022

(65) Prior Publication Data

US 2022/0181448 A1 Jun. 9, 2022

Related U.S. Application Data

(63) Continuation of application No. PCT/JP2020/012110, filed on Mar. 18, 2020.

(30) Foreign Application Priority Data

Aug. 27, 2019 (JP) .................................. 2019-154890

(51) Int. Cl.
*H10D 62/832* (2025.01)
*H01L 21/66* (2006.01)
(Continued)

(52) U.S. Cl.
CPC ......... *H10D 62/8325* (2025.01); *H01L 22/30* (2013.01); *H10D 8/00* (2025.01); *H10D 30/60* (2025.01); *H10D 30/669* (2025.01); *H10D 62/126* (2025.01); *H10D 62/405* (2025.01); *H10D 84/00* (2025.01); *H10D 84/038* (2025.01); *H10D 84/143* (2025.01); *H10D 84/83* (2025.01); *H10D 30/63* (2025.01); (Continued)

(58) Field of Classification Search
CPC ... H01L 29/1608; H01L 21/822; H01L 22/30; H01L 27/04; H01L 27/06; H01L 27/088; H01L 29/045; H01L 29/0692; H01L 29/66068; H01L 29/78; H01L 29/7804; H01L 29/7815; H01L 29/861; H01L 29/42368; H01L 29/7813; H01L 21/8234; H01L 21/8258
See application file for complete search history.

(56) References Cited

U.S. PATENT DOCUMENTS

2009/0272982 A1* 11/2009 Nakamura ........... H10D 84/146
257/77
2017/0111037 A1 4/2017 Shiigi et al.
(Continued)

FOREIGN PATENT DOCUMENTS

JP 2018-142653 A 9/2019

*Primary Examiner* — Joseph C. Nicely
*Assistant Examiner* — Alvin L Lee
(74) *Attorney, Agent, or Firm* — Posz Law Group, PLC

(57) ABSTRACT

A semiconductor device includes a semiconductor substrate having an active region in which a main switching element structure is formed, a current sense region in which a sense switching element structure is formed, and a peripheral region located around the active region and the current sense region. The semiconductor substrate is a 4H-SiC substrate having an off angle in a <11-20> direction. The current sense region is disposed in a range where the active region is not present when viewed along the <1-100> direction.

4 Claims, 5 Drawing Sheets

(51) Int. Cl.
*H10D 8/00* (2025.01)
*H10D 30/60* (2025.01)
*H10D 30/63* (2025.01)
*H10D 30/66* (2025.01)
*H10D 62/10* (2025.01)
*H10D 62/40* (2025.01)
*H10D 64/27* (2025.01)
*H10D 84/00* (2025.01)
*H10D 84/03* (2025.01)
*H10D 84/83* (2025.01)

(52) U.S. Cl.
CPC .......... *H10D 64/516* (2025.01); *H10D 84/03* (2025.01); *H10D 84/837* (2025.01)

(56) References Cited

U.S. PATENT DOCUMENTS

| | | | |
|---|---|---|---|
| 2018/0233571 A1* | 8/2018 | Akiyama | H01L 21/283 |
| 2020/0203513 A1* | 6/2020 | Konrath | H10D 62/60 |
| 2020/0395456 A1* | 12/2020 | Hoshi | H10D 30/669 |
| 2021/0151429 A1* | 5/2021 | Obata | H01L 29/4238 |

* cited by examiner

SEMICONDUCTOR DEVICE

CROSS REFERENCE TO RELATED APPLICATIONS

The present application is a continuation application of International Patent Application No. PCT/JP2020/012110 filed on Mar. 18, 2020, which designated the U.S. and claims the benefit of priority from Japanese Patent Application No. 2019-154890 filed on Aug. 27, 2019. The entire disclosures of all of the above applications are incorporated herein by reference.

TECHNICAL FIELD

The present disclosure relates to a semiconductor device.

BACKGROUND

The development of semiconductor devices manufactured using a silicon carbide (SiC) substrates is underway. The SiC substrate of this type of semiconductor device has an active region in which a main switching element structure is formed, a current sense region in which a sense switching element structure is formed, and a peripheral region located around the active region and the current sense region.

SUMMARY

The present disclosure provides a semiconductor device including a semiconductor substrate having an active region, a current sense region, and a peripheral region located around the active region and the current sense region. The semiconductor substrate is a 4H-SiC substrate having an off angle in a <11-20> direction. The current sense region is disposed in a range where the active region is not present when viewed along the <1-100> direction.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
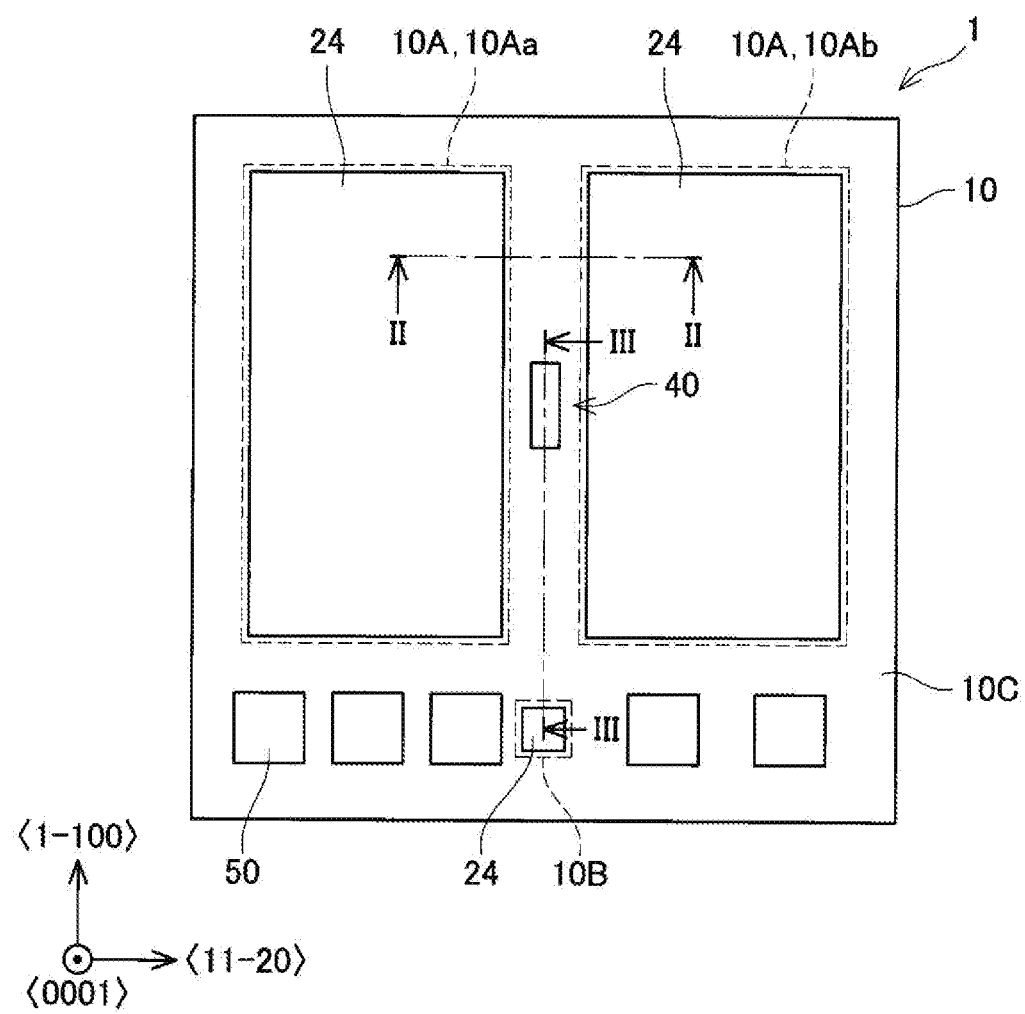
FIG. 1 is a diagram illustrating a plan view of a semiconductor device according to an embodiment.

In a semiconductor device manufactured using an SiC substrate, the SiC substrate has an active region in which a main switching element structure is formed, a current sense region in which a sense switching element structure is formed, and a peripheral region located around the active region and the current sense region. The current sense region has an area ratio of, for example, 1/1000 of the active region. This type of semiconductor device is configured to monitor a current flowing in the active region by detecting a current flowing in the current sense region and converting the detected current using a sense ratio based on the area ratio.

When this type of semiconductor device is operated, a band-shaped defect, which is a type of stacking defects, may grow in the SiC substrate. When such a band-shaped defect grows in the active region or the current sense region, an on-resistance in that region is increased. As described above, the current sense region has a relatively small area. Therefore, if a band-shaped defect grows in the current sense region, the on-resistance in the current sense region fluctuates greatly, and the current flowing in the current sense region fluctuates greatly. As a result, the sense ratio between the current flowing in the active region and the current flowing in the current sense region fluctuates greatly, and the current flowing in the active region cannot be monitored accurately.

A semiconductor device according to an aspect of the present disclosure includes a semiconductor substrate. The semiconductor substrate has an active region in which a main switching element structure is formed, a current sense region in which a sense switching element structure is formed, and a peripheral region located around the active region and the current sense region. The semiconductor substrate is a 4H-SiC substrate having an off angle in a <11-20> direction. The current sense region is disposed in a range where the active region is not present when viewed along the <1-100> direction.

When the above-described semiconductor device is operated, a band-shaped defect is formed starting from a part of the active region, and the band-shaped defect grows in the <1-100> direction. In the above-described semiconductor device, the current sense region is located in a range where the active region is not present when viewed along the <1-100> direction. Thus, the band-shaped defect that grows in the <1-100> direction from the active region is suppressed from growing in the current sense region. Therefore, in the above-described semiconductor device, even if a band-shaped defect grows in the semiconductor substrate, a fluctuation of the sense ratio between the current flowing in the active region and the current flowing in the current sense region can be suppressed. The above-described semiconductor device can maintain an accurate current monitoring function.

Hereinafter, semiconductor devices of embodiments of the present disclosure will be described with reference to the drawings. The drawings referred to below have been scaled differently from the actual semiconductor device for the purpose of illustration clarity. Also note that the scale between the drawings has been changed as necessary.

FIG. 1 illustrates a plan view of the semiconductor device 1 according to one embodiment. The semiconductor device 1 is manufactured by using a semiconductor substrate 10. The semiconductor substrate 10 is a 4H-SiC substrate having a surface in a (0001) plane, and having an off angle in a <11-20> direction.

The semiconductor substrate 10 has an active region 10A, a current sense region 10B, and a peripheral region 10C located around the active region 10A and the current sense region 10B. In the present example, the active region 10A has a pair of rectangular partial regions. One of the partial regions (a partial region on the left in FIG. 1) is referred to as a first active region 10Aa, and the other of the partial regions (a partial region on the right in FIG. 1) is referred to as a second active region 10Ab.

In the active region 10A of the semiconductor substrate 10, a main switching element structure constituting a metal-oxide-semiconductor field-effect transistor (MOSFET) is formed. In the current sense region 10B of the semiconductor substrate 10, a sense switching element structure constituting a MOSFET is also formed. The unit cells of the main switching element structure and the sense switching element structure are common. In the peripheral region 10C of the semiconductor substrate 10, a peripheral high breakdown voltage structure such as a guard ring is formed. Further, a temperature sense element 40 and multiple types of small signal pads 50 are provided on the peripheral region 10C of the semiconductor substrate 10.

Figure 2:
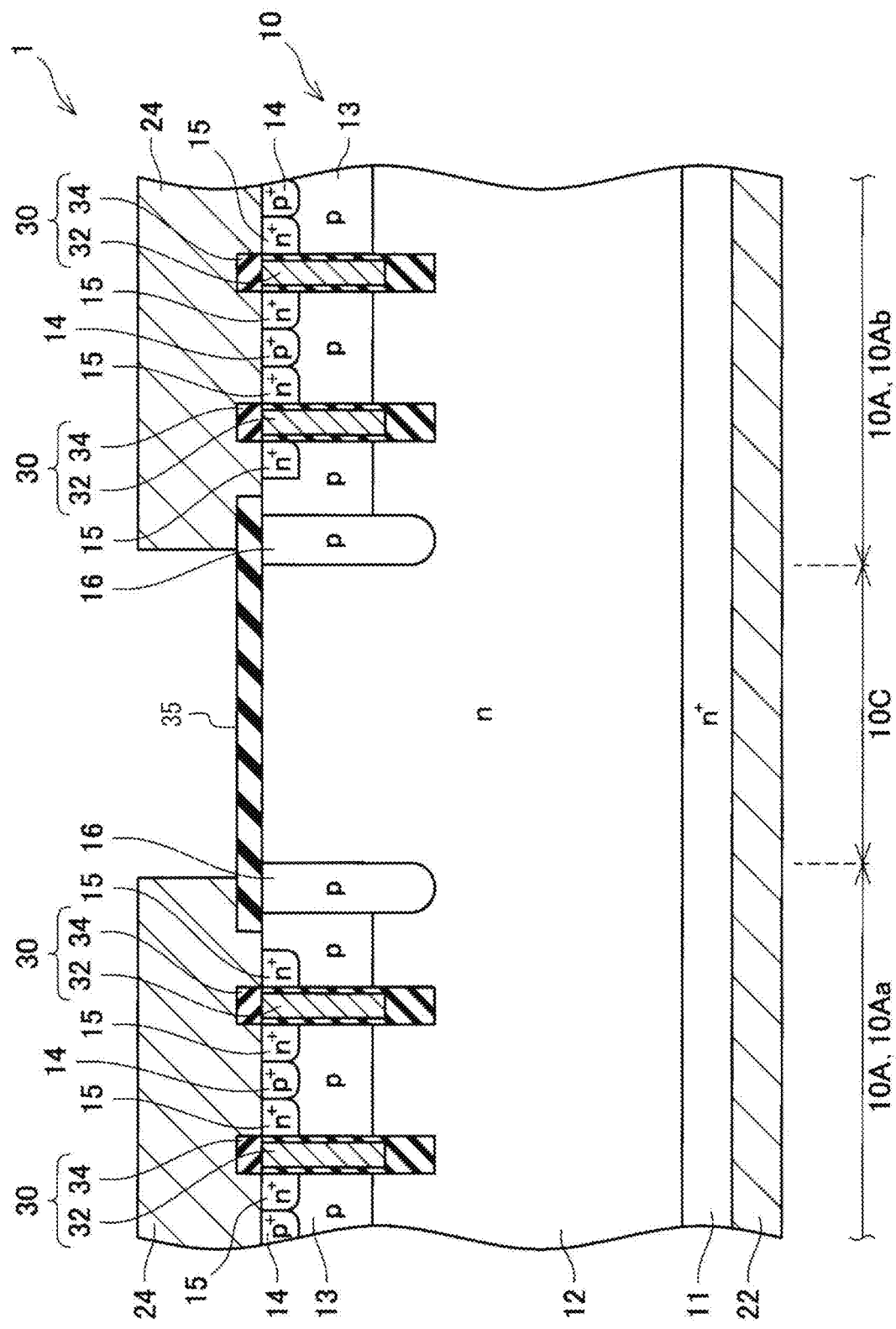
FIG. 2 is a diagram illustrating a cross-sectional view of the semiconductor device taken along line II-II in FIG. 1.
Figure 3:
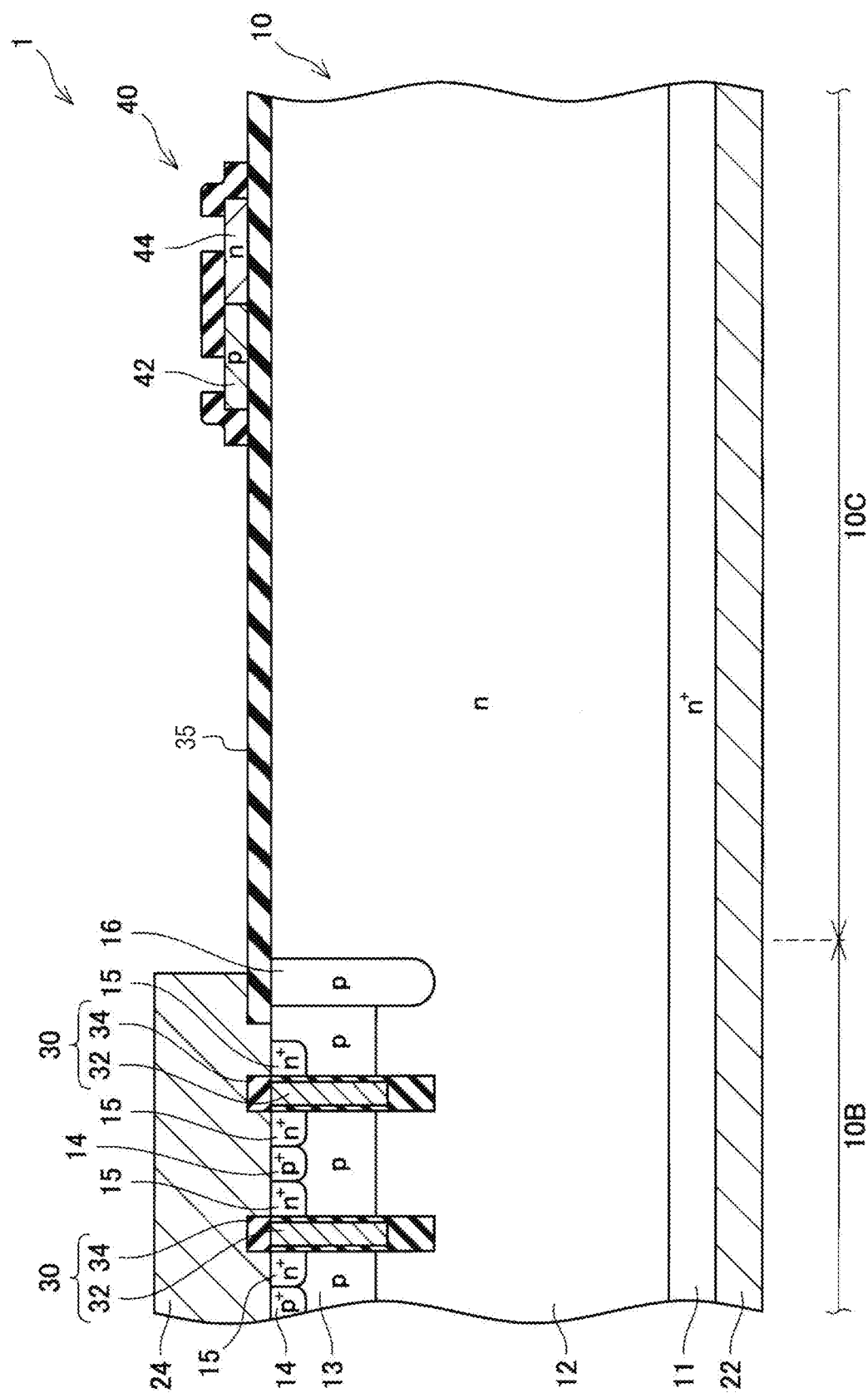
FIG. 3 is a diagram illustrating a cross-sectional view of the semiconductor device taken along line III-III in FIG. 1.

FIG. 2 illustrates a cross-sectional view of the semiconductor device 1 taken along line II-II in FIG. 1. FIG. 3 illustrates a cross-sectional view of the semiconductor device 1 taken along line III-III in FIG. 1. As shown in FIGS. 2 and 3, the MOSFET formed in each of the active region 10A and the current sense region 10B includes a drain electrode 22, a source electrode 24, and trench gate portions 30.

The drain electrode 22 is disposed on a rear surface of the semiconductor substrate 10. The source electrodes 24 are disposed on the active region 10A and the current sense region 10B of the semiconductor substrate 10. The trench gate portions 30 are disposed on surface layer portions of the active region 10A and the current sense region 10B of the semiconductor substrate 10. Each of the trench gate portions 30 has a gate electrode 32 and a gate insulating film 34. The gate electrode 32 is insulated from the semiconductor substrate 10 by the gate insulating film 34.

The semiconductor substrate 10 includes an $n^+$ type drain region 11, an n type drift region 12, a p type body region 13, a $p^+$ type body contact region 14, an $n^+$ type source region 15, and a p type deep region 16.

The drain region 11 is provided in a rear surface portion of the semiconductor substrate 10 and is located at a position exposed on the rear surface of the semiconductor substrate 10. The drain region 11 is a base substrate for epitaxial growth of the drift region 12. The drain region 11 is in ohmic contact with the drain electrode 22 that covers the rear surface of the semiconductor substrate 10.

The drift region 12 is provided on the drain region 11 and separates the drain region 11 from the body region 13. The drift region 12 is formed by crystal growth from a surface of the drain region 11 by using an epitaxial growth technique.

The body region 13 is provided on the drift region 12 at positions corresponding to the active region 10A and the current sense region 10B, and is located in the surface layer portion of the semiconductor substrate 10. The body region 13 is formed in the surface layer portion of the semiconductor substrate 10 by ion implantation of aluminum toward the surface of the semiconductor substrate 10 by using the ion implantation technique.

The body contact region 14 is provided on the body region 13 and is located on the surface layer portion of the semiconductor substrate 10. The body contact region 14 is exposed on the surface of the semiconductor substrate 10. The body contact region 14 is a region where the concentration of p-type impurities is higher than that of the body region 13, and is in ohmic contact with the source electrode 24. Accordingly, the body region 13 is electrically connected to the source electrode 24 via the body contact region 14. The body contact region 14 is formed in the surface layer portion of the semiconductor substrate 10 by ion implantation of aluminum toward the surface of the semiconductor substrate 10 by using the ion implantation technique.

The source region 15 is provided on the body region 13 and is located in the surface layer portion of the semiconductor substrate 10. The source region 15 is exposed on the surface of the semiconductor substrate 10. The source region 15 is separated from the drift region 12 by the body region 13 and is in contact with the side surface of the trench gate portion 30. The source region 15 is in ohmic contact with the source electrodes 24. The source region 15 is formed in the surface layer portion of the semiconductor substrate 10 by ion implantation of nitrogen toward the surface of the semiconductor substrate 10 by using the ion implantation technique.

The deep region 16 is provided adjacent to the body region 13 and is located in the surface layer portion of the semiconductor substrate 10. The deep region 16 is exposed on the surface of the semiconductor substrate 10. The deep region 16 is formed along a boundary between the active region 10A and the peripheral region 10C and a boundary between the current sense region 10B and the peripheral region 10C. The deep region 16 is formed deeper than the body region 13. The deep region 16 is formed in the surface layer portion of the semiconductor substrate 10 by ion implantation of boron toward the front surface of the semiconductor substrate 10 by using the ion implantation technique.

As described above, MOSFETs having the common unit cell are formed in the active region 10A and the current sense region 10B. The current sense region 10B has an area ratio of, for example, 1/1000 of the active region 10A. In the semiconductor device 1, the current flowing in the active region is detected, and the detected current is converted using the sense ratio based on the area ratio so as to monitor the current flowing in the active region 10A.

In the surface layer portion of the peripheral region 10C of the semiconductor substrate 10, a peripheral high breakdown voltage structure such as a guard ring structure or resurfacing structure is formed. However, such a peripheral high breakdown voltage structure is omitted in FIGS. 2 and 3 for the purpose of clarification.

As shown in FIG. 3, the temperature sense element 40 is provided on the peripheral region 10C of the semiconductor substrate, and is composed of a polysilicon layer disposed on an interlayer insulating film 35 on the semiconductor substrate 10. The temperature sense element 40 is a diode element having a p type anode region 42 and an n type cathode region 44, and the anode region 42 and the cathode region 44 are adjacent to each other. The temperature sense element 40 is formed by ion implantation of p-type impurities and n-type impurities into the polysilicon layer by using the ion implantation technique. The temperature sense element 40 detects the temperature by using a characteristic that the forward voltage changes depending on a change in temperature. In this example, the temperature sense element 40 is provided on the semiconductor substrate 10, but instead of this example, the temperature sense element 40 may be provided in the semiconductor substrate 10.

Returning to FIG. 1. In the semiconductor device 1, the current sense region 10B is located in a range where the active region 10A is not present when viewed along the <1-100> direction. More specifically, the current sense region 10B is disposed between the first active region 10Aa and the second active region 10Ab when viewed along the <1-100> direction. Further, the current sense region 10B is disposed between the small signal pads 50. More specifically, the current sense region 10B is disposed between the small signal pads 50 in the <11-20> direction.

Further, in the semiconductor device 1, the temperature sense element 40 is disposed in a portion of the peripheral region 10C located between the first active region 10Aa and the second active region 10Ab. In this way, the temperature sense element 40 and the current sense region 10B are disposed so as to face each other in the <1-100> direction.

Figure 4:
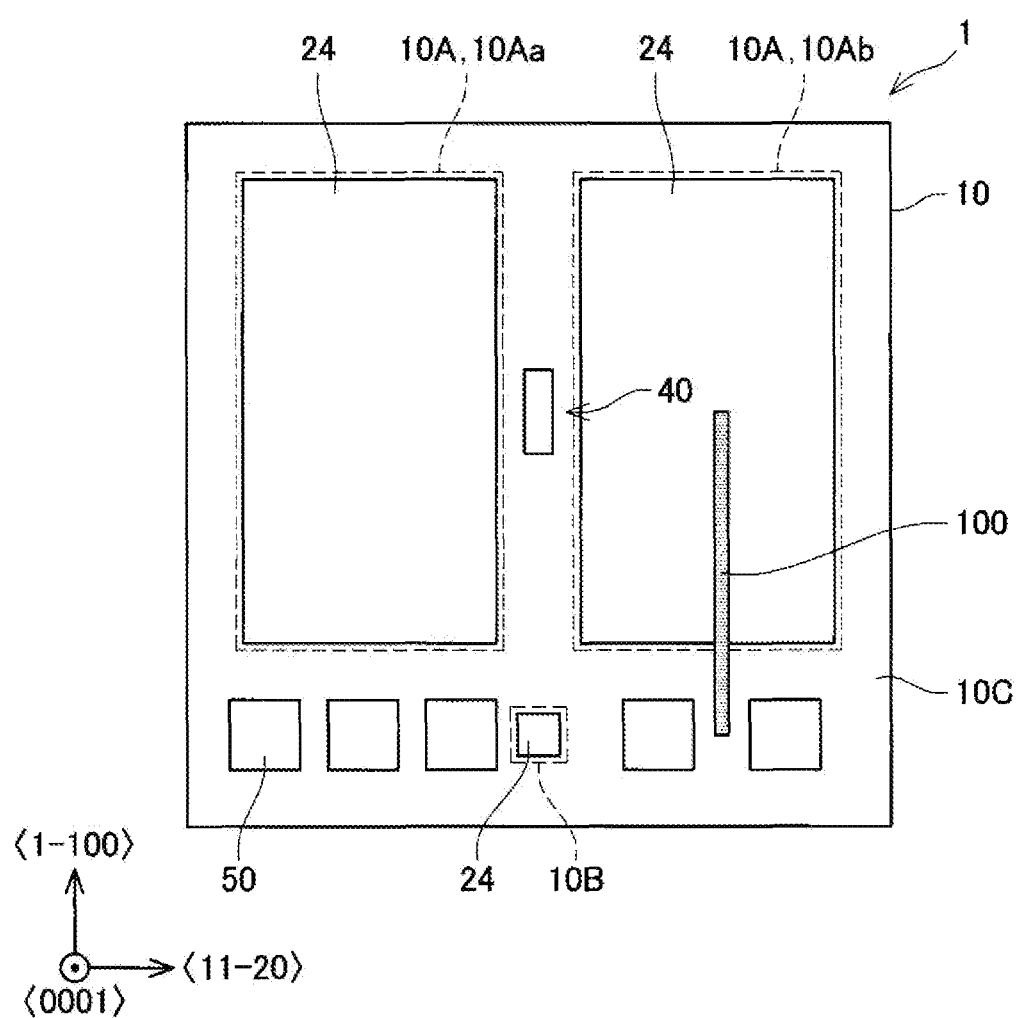
FIG. 4 is a diagram illustrating a plan view of the semiconductor device on which a formed band-shaped defect is superimposed.

Next, the features of the semiconductor device 1 will be described with reference to FIG. 4. As described above, the semiconductor device 1 is formed by epitaxial growth of the drift region 12 from the surface of the drain region 11, which is the base substrate. Therefore, as is well known, in the vicinity of the interface between the drain region 11 and the drift region 12, basal plane dislocations (BPD) and threading edge dislocations (TED) converted from the basal plane dislocations are present.

In the switching operation of the semiconductor device 1, a reverse bias mode in which the potential of the source electrode 24 is higher than the potential of the drain electrode 22 occurs. In the reverse bias mode, since a built-in pn diode composed of the body region 13 and the drift region 12 is forward-biased, so that the built-in pn diode can operate as a freewheel diode. As a result, in the reverse bias mode, holes are injected from the body region 13 into the drift region 12. At this time, when the injected holes reach the basal plane dislocation or the through edge dislocation, a stacking defect originating from the dislocation expands, and a band-shaped defect 100 appears in the semiconductor substrate 10. The band-shaped defect 100 grows along the <1-100> direction, and a width of the band-shaped defect 100 may reach about 200 μm.

As described above, such the band-shaped defect 100 is formed when holes injected by the operation of the built-in pn diode reach the basal plane dislocation or the through-blade dislocation. Therefore, the band-shaped defect 100 starts from the basal plane dislocation or the through edge dislocation present in the active region 10A, and grows along the <1-100> direction.

In the semiconductor device 1, the current sense region 10B is located in the range where the active region 10A is not present when viewed along the <1-100> direction. Therefore, in the semiconductor device 1, the band-shaped defect 100 growing from the active region 10A is suppressed from passing through the current sense region 10B.

If the band-shaped defect 100 grows in the current sense region 10B, an on-resistance of the current sense region 10B is increased. As described above, the current sense region 10B has a relatively small area. Therefore, if the band-shaped defect 100 grows in the current sense region 10B, the on-resistance in the current sense region 10B fluctuates greatly, and the current flowing in the current sense region 10B fluctuates greatly. As a result, the sense ratio between the current flowing in the active region 10A and the current flowing in the current sense region 10B fluctuates greatly, and the current flowing in the active region 10A cannot be monitored accurately.

On the other hand, in the semiconductor device 1, as described above, the band-shaped defect 100 is suppressed from growing in the current sense region 10B. Although the band-shaped defect 100 is formed in the active region 10A, since the active region 10A has a relatively large area, the fluctuation of the on-resistance is small. Thus, in the semiconductor device 1, even if the band-shaped defect 100 is formed in the semiconductor substrate 10, the fluctuation of the sense ratio between the current flowing in the active region 10A and the current flowing in the current sense region 10B is suppressed. Therefore, the semiconductor device 1 can maintain an accurate current monitoring function.

Further, in the semiconductor device 1, the current sense region 10B is disposed between the first active region 10Aa and the second active region 10Ab when viewed along the <1-100> direction. The portion of the peripheral region 10C between the first active region 10Aa and the second active region 10Ab is a region to be secured for arranging the wiring connected to the gate electrode 32, the wiring connected to the temperature sense element 40, and the like. Further, in the semiconductor device 1, the temperature sense element 40 is disposed in the portion of the peripheral region 10C between the first active region 10Aa and the second active region 10Ab. That is, the current sense region 10B is disposed so as to corresponding to the region where the active region 10A is not formed for the purpose of arranging the various wirings and the temperature sense element 40. Therefore, in the semiconductor device 1, without reducing the area of the active region 10A, the current sense region 10B can be disposed in a positional relationship where the active region 10A is not present along the <1-100> direction.

Figure 5:
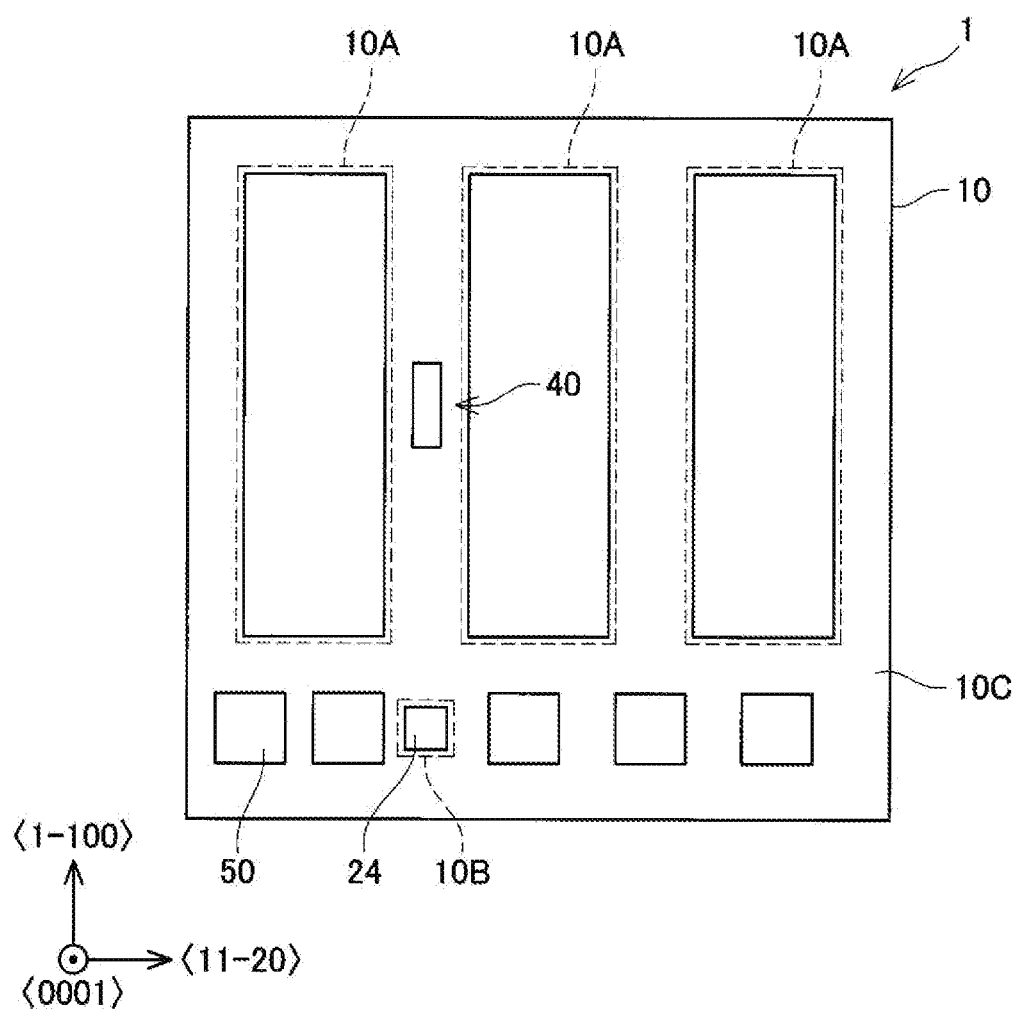
FIG. 5 is a diagram illustrating a plan view of a semiconductor device according to a modification.

In the above embodiment, the case where the active region 10A is composed of the pair of partial regions, that is, the first active region 10Aa and the second active region 10Ab has been exemplified. As shown in FIG. 5, the number of partial regions constituting the active region 10A may be three. Also in this case, the current sense region 10B is arranged between the partial regions of the active region 10A when viewed along the <1-100> direction. The same applies even if the number of partial regions constituting the active region 10A is four or more. Further, the current sense region 10B and the temperature sense element 40 may be disposed so as to face each other in the <1-100> direction, or may be disposed not to face each other in the <1-100> direction.

Although the embodiments have been described in detail above, these are merely examples and do not limit the scope of claims. The techniques described in the claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:
1. A semiconductor device comprising:
   a semiconductor substrate having
      an active region in which a main switching element structure is formed,
      a current sense region in which a sense switching element structure is formed, and
      a peripheral region located around the active region and the current sense region, wherein
   the semiconductor substrate is a 4H-SiC substrate having an off angle in a <11-20> direction,
   the current sense region is disposed at a location in the semiconductor substrate where the active region is not present when viewed along a <1-100> direction,
   under an operating condition, a defect grows in the active region in the <1-100> direction, and
   because of the location of the current sense region, the defect is suppressed from growing in the current sense region.
2. The semiconductor device according to claim 1, wherein
   the active region has a first active region and a second active region, the first active region and the second active region are disposed apart from each other in the semiconductor substrate, and the current sense region is disposed between the first active region and the second active region when viewed along the <1-100> direction.

3. The semiconductor device according to claim 2, further comprising a temperature sense element disposed in a portion of the peripheral region located between the first active region and the second active region.

4. The semiconductor device according to claim 2, wherein the first active region and the second active region are apart from each other when viewed along the <1-100> direction, and the current sense region is disposed at a position that is located between the first active region and the second active region when viewed along the <1-100> direction and is apart from the first active region and the second active region when viewed along the <11-20> direction.

* * * * *